United States Patent
Kikuchi et al.

(10) Patent No.: US 7,206,239 B2
(45) Date of Patent: Apr. 17, 2007

(54) SEMICONDUCTOR DEVICE AND SKEW ADJUSTING METHOD

(75) Inventors: Kazuhiko Kikuchi, Kawasaki (JP); Masaya Kitagawa, Kawasaki (JP); Jun Masuko, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1 day.

(21) Appl. No.: 11/260,199

(22) Filed: Oct. 28, 2005

(65) Prior Publication Data

US 2006/0215469 A1    Sep. 28, 2006

(30) Foreign Application Priority Data

Mar. 28, 2005    (JP)    ............... 2005-092064

(51) Int. Cl.
  *G11C 29/00* (2006.01)
  *G11C 7/00* (2006.01)
(52) U.S. Cl. .............. 365/201; 365/232; 365/236; 713/500; 713/502; 713/503
(58) Field of Classification Search ........... 365/201, 365/232, 236; 713/500, 502, 503
See application file for complete search history.

(56) References Cited

U.S. PATENT DOCUMENTS 5,995,441 A * 11/1999 Kato et al. ............. 365/233
6,489,819 B1 * 12/2002 Kono et al. ............. 327/141
6,915,443 B2 * 7/2005 McBride et al. ........... 713/503
2003/0226055 A1   12/2003 Yoshitake

FOREIGN PATENT DOCUMENTS

JP    2003-271447    9/2003

* cited by examiner

Primary Examiner—Anh Phung
Assistant Examiner—Toan Le
(74) Attorney, Agent, or Firm—Arent Fox LLP

(57) ABSTRACT

Function circuits composing one function macro are divided and mounted on plural chips, plural internal clock signals having different phases with one another are generated based on a clock signal to be a reference, a phase of a clock signal supplied to the function circuits within the chips is adjusted based on a result of a test operation performed by using a selected internal clock signal, a clock signal with an optimal phase is obtained from among the plural internal clock signals having the different phases with one another, and a skew generated by being divided into the plural chips is adjusted automatically to thereby realize a proper operation of the circuits as a whole.

13 Claims, 5 Drawing Sheets

F I G. 4
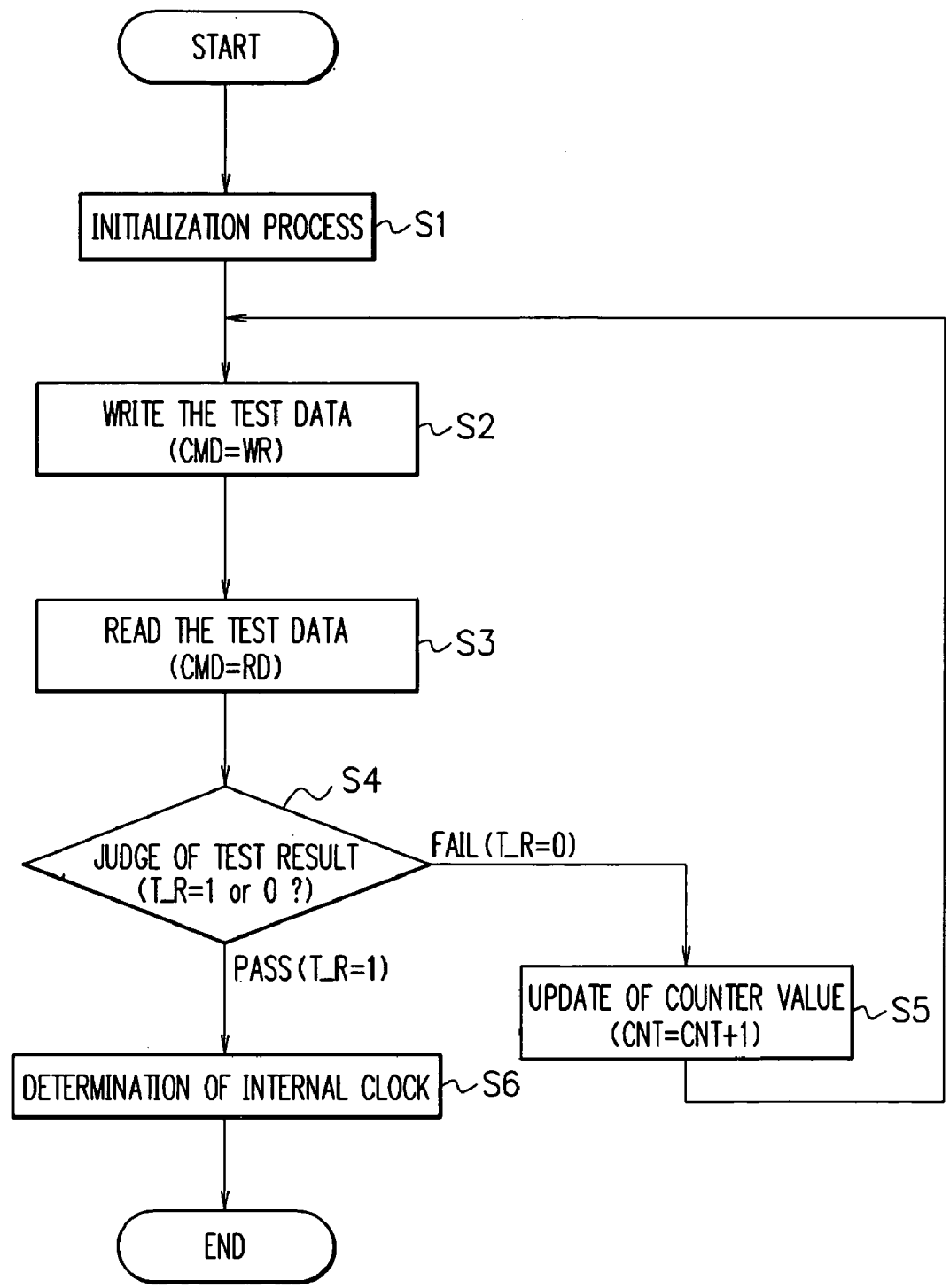

SEMICONDUCTOR DEVICE AND SKEW ADJUSTING METHOD

CROSS-REFERENCE TO RELATED APPLICATIONS

This application is based upon and claims the benefit of priority from the prior Japanese Patent Application No. 2005-092064, filed on Mar. 28, 2005, the entire contents of which are incorporated herein by reference.

BACKGROUND OF THE INVENTION

1. Field of the Invention

The present invention relates to a semiconductor device and a skew adjusting method, and in detail to a skew adjusting technique between chips in circuits divided into the plural chips.

2. Description of the Related Art

Conventionally, in a memory controller, a reduction of a skew between an address signal and a data signal (hereinafter, called also as "between address and data") has been realized by mounting every circuit composing the memory controller on one chip. However, there are quite a lot of cases in which an enough number of pins (number of external terminals) cannot be secured on one chip in accordance with improvements of functions according to complication, multifunction, and so on of functions, regardless of a multi-pin packaging in recent years.

When the memory controller is realized by being divided into plural chips, a skew adjusting between address and data becomes very hard. This becomes a factor disturbing the memory controller from being divided into plural chips.

Here, in a memory system having replaceable SDRAM modules, a method to adjust a clock skew generated according to a difference of memory capacities (load capacitance) by each SDRAM module, is proposed (for example, refer to Patent Document 1). In the method shown in the Patent Document 1, phase adjustments of clocks supplied to the SDRAM modules are performed by controlling a phase adjuster based on stored adjusting value setting information and memory capacity information obtained from the attached SDRAM modules. However, in the method shown in the Patent Document 1, it is necessary to set and store the adjusting value setting information and the memory capacity information beforehand, and therefore, it is difficult to flexibly correspond to arbitrary SDRAM module.

Besides, there is a case when it is impossible to mount the memory controller on one chip according to not only a restriction of number of pins held by the chip, but also a restriction of electric power consumption caused by an increase of a circuit scale and so on.

[Patent Document 1] Japanese Patent Application Laid-open No. 2003-271447

SUMMARY OF THE INVENTION

One possible object is to adjust a skew generated by dividing circuits into plural chips automatically, and to enable proper operations of the circuits as a whole when the circuits corresponding to one function macro of a memory controller and so on are realized by being divided into the plural chips.

In a semiconductor device of the present invention, function circuits composing one function macro are divided and mounted on plural chips, internal clock signals having different phases with one another are generated based on a clock signal to be a reference, one of the generated internal clock signals is selected, and a phase of a clock signal supplied to the function circuits within the chips is adjusted based on a result of a test operation executed by using the selected internal clock signal.

Herewith, the clock signal having an optimal phase which is phase adjusted based on the result of the test operation can be obtained from among the plural internal clock signals having different phases with one another, even through the circuits composing one function macro are divided into the plural chips.

BRIEF DESCRIPTION OF THE DRAWINGS

FIG. 4 is a flow chart showing an adjusting process of a clock phase according to the present embodiment.

DETAILED DESCRIPTION OF THE PREFERRED EMBODIMENTS

Hereinafter, an embodiment of the present invention is described based on the drawings.

Incidentally, in the following description, a memory controller (memory control circuit) is shown as an example of a semiconductor device according to the embodiment of the present invention, but the present invention is not limited to this. The present invention is applicable for other circuits, for example, an interface circuit, a clock data recovery circuit, and so on, including the exemplified memory controller, of which operations are influenced by a skew.

Figure 1:
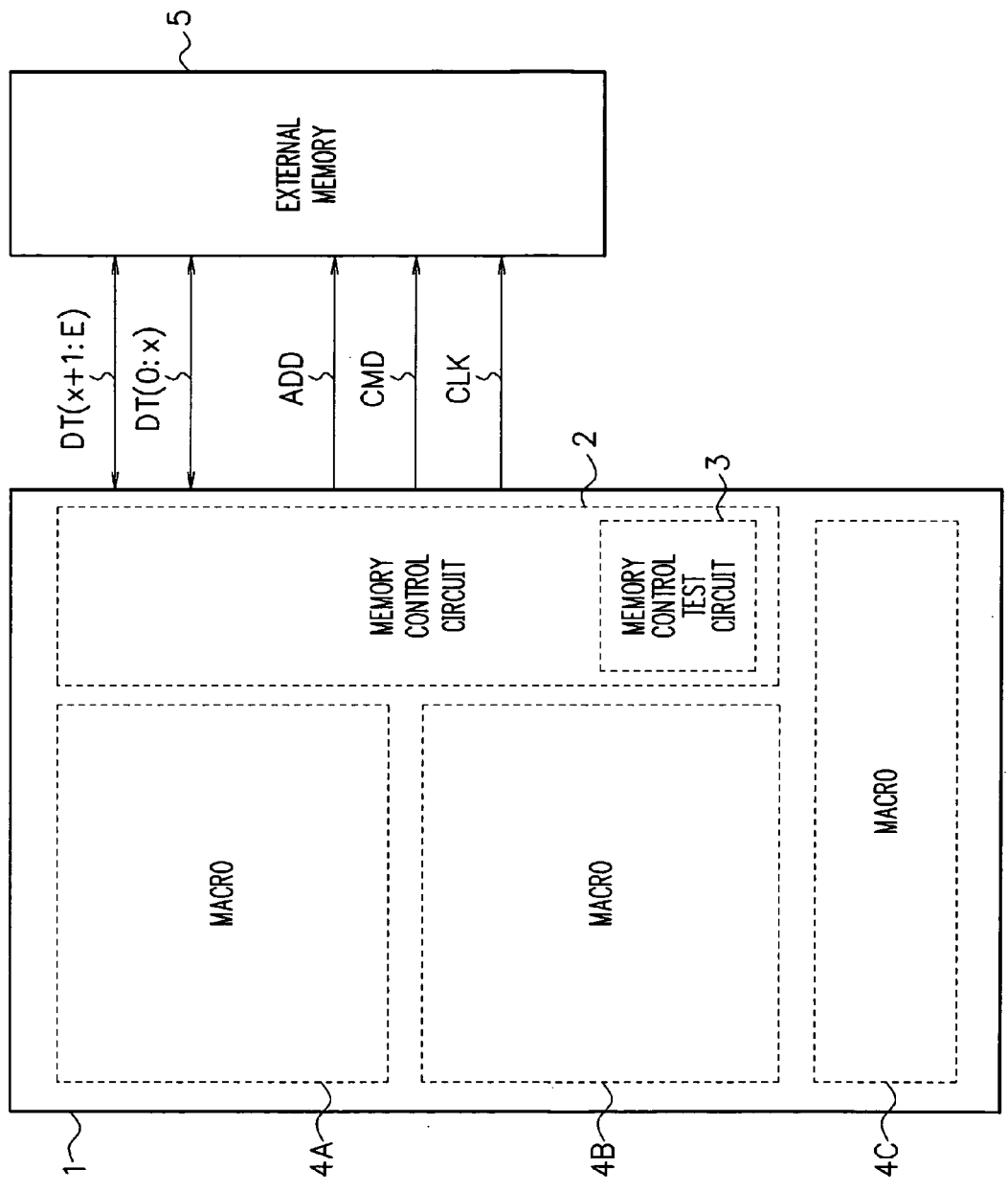
FIG. 1 is a block diagram showing a function configuration example of a memory system according to an embodiment of the present invention.

FIG. 1 is a block diagram showing a function configuration example of a memory system having the memory controller applying the semiconductor device according to one embodiment of the present invention.

In FIG. 1, a reference numeral 1 denotes a control unit, and a reference numeral 5 denotes an external memory. The control unit 1 has a memory controller (memory control circuit) 2 and plural macros 4A to 4C.

The memory controller 2 performs an access and so on to an external memory 5 in accordance with a request from external, and controls the external memory 5. In the present embodiment, the memory controller 2 supplies the external memory 5 with an address signal ADD and a command signal CMD in accordance with a request and so on from external, and exchanges a data signal DT with the external memory 5. Incidentally, in FIG. 1, the data signals DT are shown in the drawing divided into the data signal DT (0: x) corresponding to lower side (x+1) bits, and the data signal DT (x+1: E) corresponding to upper side (E−x) bits.

Besides, the memory controller 2 has a memory control test circuit 3. The memory control test circuit 3 is a function circuit performing a self test of a memory, and it is so-called a BIST (Built In Self Test) circuit (RAMBIST circuit in more detail).

The macros 4A to 4C are circuits for achieving respective arbitrary functions.

Here, the circuits composing the memory controller 2 as one function macro such as shown in FIG. 1 are conventionally mounted in bulk on one chip, but in the present embodiment, the circuits are mounted while being divided into plural chips.

Concretely speaking, an address generation portion and a data input/output portion in the memory controller 2 are respectively constituted on other chips, namely on different chips. Besides, the memory control test circuit 3 is also divided into a function portion concerning an address and a function portion concerning a data as well as the memory controller 2. Incidentally, in the following description, the data input/output portion in the memory controller 2 is further divided into an upper data side and a lower data side, and they are respectively constituted on other chips.

As stated above, the address generation portion and the data input/output portions in the memory controller 2 are constituted on other chips, and therefore, normally, a skew between address and data, in other words between chips are generated. In the present embodiment, the skew between address and data generated by being divided into plural chips are adjusted by using a function of the memory control test circuit 3 to realize a reduction of the skew.

Figure 2:
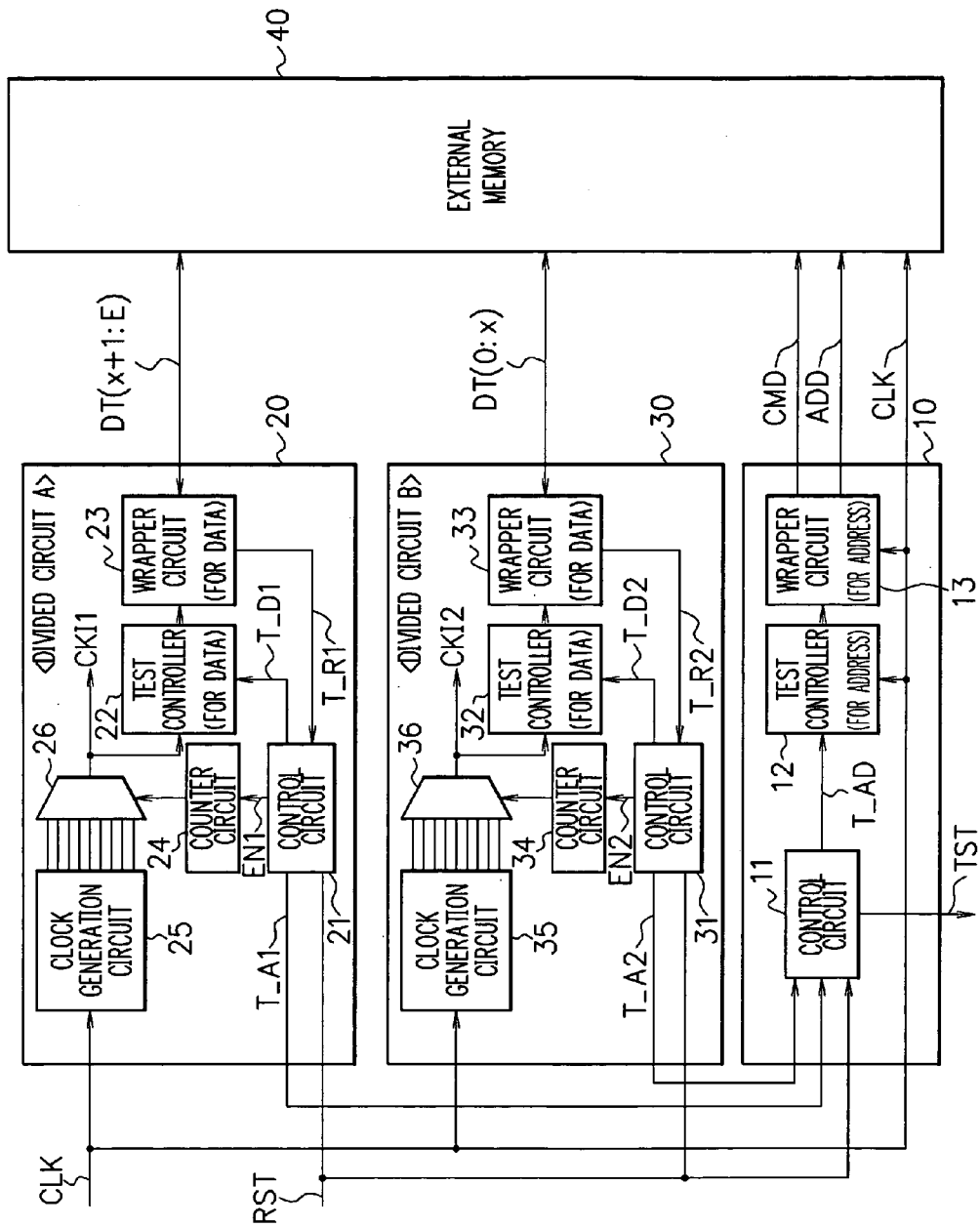
FIG. 2 is a view showing a configuration example of a memory controller according to the present embodiment.

FIG. 2 is a view showing a configuration example of the memory controller according to the embodiment of the present invention. Incidentally, in FIG. 2, only a portion relating to a skew adjustment (phase adjustment of clock signal) within the memory controller is shown, and the other configuration is not shown because it is the same as conventional one except for being divided into the address portion and the data portion (upper side and lower side).

In FIG. 2, a reference numeral 10 denotes an address generation circuit, a reference numeral 20 denotes a first data input/output circuit (divided circuit A), a reference numeral 30 denotes a second data input/output circuit (divided circuit B), and a reference numeral 40 denotes an external memory. The address generation circuit 10, the first data input/output circuit 20, and the second data input/output circuit 30 are constituted on different chips with one another. Incidentally, the first data input/output circuit 20 corresponds to upper side (E−x) bits of data, in detail, from (x+1) bit to E bit of data. Similarly, the second data input/output circuit 30 corresponds to lower side (x+1) bits of data, in detail, from 0 bit to x bit of data.

The address generation circuit 10 has a control circuit 11, a test controller (for address) 12, and a wrapper circuit (for address) 13.

The control circuit 11 achieves an overall control of the address generation circuit 10. A reset signal RST from external is inputted to the control circuit 11. Test mode signals T_A1, T_A2 are inputted from the first and second data input/output circuits 20, 30 to the control circuit 11. The control circuit 11 outputs a test signal TST and a test mode signal T_AD indicating whether it is in a test operation state or not in accordance with the reset signal RST and the test mode signals T_A1, T_A2.

The test controller 12 performs a state transition control and a generation of a test address for executing a test algorithm necessary for a memory test at the time of the test operation. The test mode signal T_AD is inputted from the control circuit 11 to the test controller 12. The test controller 12 operates in accordance with the test mode signal T_AD.

The wrapper circuit 13 is a circuit for wrapping a memory. The wrapper circuit 13 receives a control by the test controller 12, and supplies the external memory 40 being a test object with the test address and a command generated at the test controller 12 by an address signal ADD and a command signal CMD.

Incidentally, a clock signal CLK to be a reference is supplied to the test controller 12 and the wrapper circuit 13. The test address and the command are supplied to the external memory 40 based on (for example, in synchronization with) this clock signal CLK. Incidentally, the clock signal CLK to be the reference is also supplied to the external memory 40.

The first data input/output circuit 20 has a control circuit 21, a test controller (for data) 22, a wrapper circuit (for data) 23, a counter circuit 24, a clock generation circuit 25, and a clock selection circuit 26. Besides, the second data input/output circuit 30 has a control circuit 31, a test controller (for data) 32, a wrapper circuit (for data) 33, a counter circuit 34, a clock generation circuit 35, and a clock selection circuit 36. Incidentally, as it is obvious, the configurations of the first and second data input/output circuits 20, 30 are the same, and therefore, it is described in detail as for the first data input/output circuit 20 in the following, and the description of the second data input/output circuit 30 is not given.

The control circuit 21 achieves an overall control of the data input/output circuit 20. The reset signal RST from external is inputted to the control circuit 21. A test mode signal T_R1 showing a test result is inputted from the wrapper circuit 23 to the control circuit 21. The control circuit 21 outputs the test mode signals T_A1, T_D1, and a counter enable signal EN1 in accordance with the reset signal RST and the test mode signal T_R1.

The test controller 22 performs a state transition control and a generation of a test data for executing a test algorithm required for a memory test at a time of a test operation. The test mode signal T_D1 is inputted to the test controller 22 from the control circuit 21. The test controller 22 operates in accordance with the test mode signal T_D1.

The wrapper circuit 23 is a circuit for wrapping a memory. The wrapper circuit 23 receives a control by the test controller 22, supplies the external memory 40 being the test object with the test data generated at the test controller 22 by a data signal DT (x+1: E), and receives an output from the external memory 40. Besides, the wrapper circuit 23 compares an output result from the external memory 40 and the supplied test data, judges if they are consistent or not, and outputs the judged result as the test mode signal T_R1.

The counter circuit 24 performs a count operation in accordance with the counter enable signal EN1 supplied from the control circuit 21, and outputs a counter value CNT to the clock selection circuit 26.

The clock signal CLK to be the reference is inputted to the clock generation circuit 25. The clock generation circuit 25 generates and outputs plural internal clock signals having different phases with one another based on the clock signal CLK.

The internal clock signals having the different phases with one another generated at the clock generation circuit 25 are inputted to the clock selection circuit 26. The clock selection circuit 26 selects one internal clock signal in accordance with the counter value CNT supplied from the counter circuit 24 from among the inputted internal clock signals, to output as an internal clock signal CKI1.

Here, the internal clock signal CKI1 outputted from the clock selection circuit 26 is supplied to the test controller 22. The test data is supplied to the external memory 40 based on (for example, in synchronization with) this internal clock signal CKI1.

Figure 3:
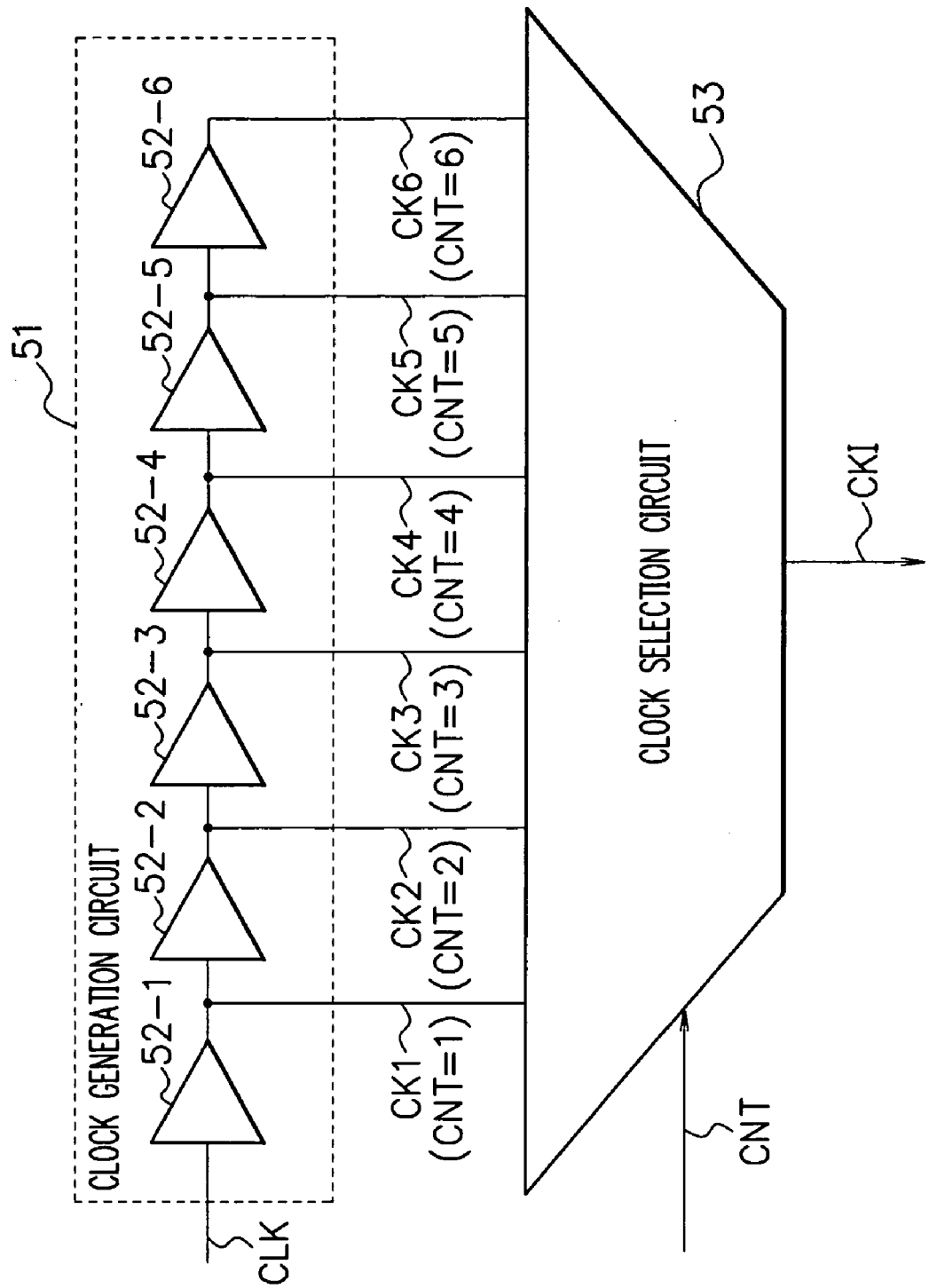
FIG. 3 is a view showing a configuration of a clock generation circuit.

FIG. 3 is a view showing a configuration of the clock generation circuit held by the data input/output circuits 20, 30 shown in FIG. 2. Incidentally, in FIG. 3, a clock generation circuit 51 generating six internal clock signals having different phases with one another based on the clock signal CLK to be the reference is shown as an example.

The clock generation circuit 51 is constituted by connecting delay elements 52-1 to 52-6 in cascade as shown in FIG. 3. The clock signal CLK to be the reference is supplied to an input end of the delay element 52-1 at a first stage. Besides, junction points of the respective delay elements 52-1 to 52-6 are connected to input ends of a clock selection circuit 53, and thereby, internal clock signals CK1 to CK6 having different phases with one another generated based on the clock signal CLK are supplied to the clock selection circuit 53.

In the example shown in FIG. 3, the clock selection circuit 53 outputs a supplied internal clock signal CKi as an internal clock signal CKI when the count value CNT supplied from the counter circuit is "i" ("i" is a natural number from 1 to 6) as shown in the drawing.

Incidentally, in FIG. 3, the clock generation circuit 51 generating the six internal clock signals CK1 to CK6 having the different phases with one another by using the six delay elements 52-1 to 52-6 is shown as an example, but the present invention is not limited to this, and any conventionally known clock generation circuit generating clock signals having different phases with one another based on a clock signal to be a reference can be applied.

Next, operations are described.

Incidentally, only a skew adjusting operation (phase adjusting operation of clock signal) is described below. The other operations at a normal time may be performed as same as the conventional way, and therefore, the description will not be given.

FIG. 4 is a flow chart showing a phase adjusting process of the clock signal in the present embodiment.

First, the reset signal RST supplied from external is activated, and an initialization process is performed (step S1). By the initialization process of the step S1, logical values of the respective signals become as follows, the test signal TST is "0" (zero), the test mode signals T_A1, T_A2, T_D1, and T_D2 are "0", respective control circuit internal logical signals PASS (not shown) are "0", and the counter value CNT is "1". Here, the control circuit internal logical signal PASS is a signal indicating a selection of the clock signal. When the signal is "0", it means to go next, and when the signal is "1", it means to be a final decision. Namely, the adjustment of the skew is performed during the control circuit internal logical signal PASS is "0".

Next, the test data are written to the external memory 40 by the address generation circuit 10 and the data input/output circuits 20, 30 in accordance with the controls of the respective test controllers 12, 22, and 32 (step S2).

Next, the data are read from the external memory 40 by the address generation circuit 10 and the data input/output circuits 20, 30 in accordance with the controls of the respective test controllers 12, 22, and 32 (step S3). Concretely speaking, the data is read from a region in the external memory 40 where the test data is written at the step S2.

Subsequently, the wrapper circuits 23, 33 in the data input/output circuits 20, 30 compare the test data written at the step S2 and the data read at the step S3 (step S4).

As a result, when the test data and the read data are inconsistent, the wrapper circuits 23, 33 judge that the test result is FAIL (abnormal operation is verified at the test operation), and change the logical values of the test mode signals T_R1, T_R2 to "0". When the logical values of the test mode signals T_R1, T_R2 are "0", the logical values of the test signal TST, the test mode signals T_A1, T_A2, T_D1, and T_D2 are not changed, the logical values of the counter enable signals EN1, EN2 are "0", and only the counter value CNT is incremented by "1" (step S5) Incidentally, it may be decremented depending on a specification of the counter circuit.

Then, the process goes back to the step S2, and the processes subsequent to the step S2 are performed again. Herewith, when the test result is judged as FAIL (abnormal operation is verified at the test operation), the counter value CNT is updated, and thereby, the next internal clock signal having the different phase is selected automatically, and the processes stated above are performed.

Meanwhile, when the test data and the read data are consistent as a result of the comparison at the step S4, the wrapper circuits 23, 33 judge that the test result is PASS (normal operation is verified at the test operation), and change the logical values of the test mode signals T_R1, T_R2 to "1". Herewith, the logical values of the test signal TST, the test mode signals T_A1, T_A2, T_D1, and T_D2 are changed to "1", the logical value of the control circuit internal logical signal PASS is changed to "1", and the internal clock signals CKI1, CKI2 at that time are determined as the internal clock signals of which clock phases are adjusted (skew adjusted) (step S6).

Incidentally, in the description stated above, the operations of the data input/output circuits 20, 30 are described all at once, but the judges of the test results and the determinations of the internal clocks in accordance with the test results are performed by the data input/output circuits 20, 30 independently. As stated above, the test operation is performed one after another while shifting the phases of the internal clock signals CKI1, CKI2, and thereby, the phase adjustments of the clock signals at the respective chips on which the data input/output circuits 20, 30 are constituted are achieved.

Figure 5:
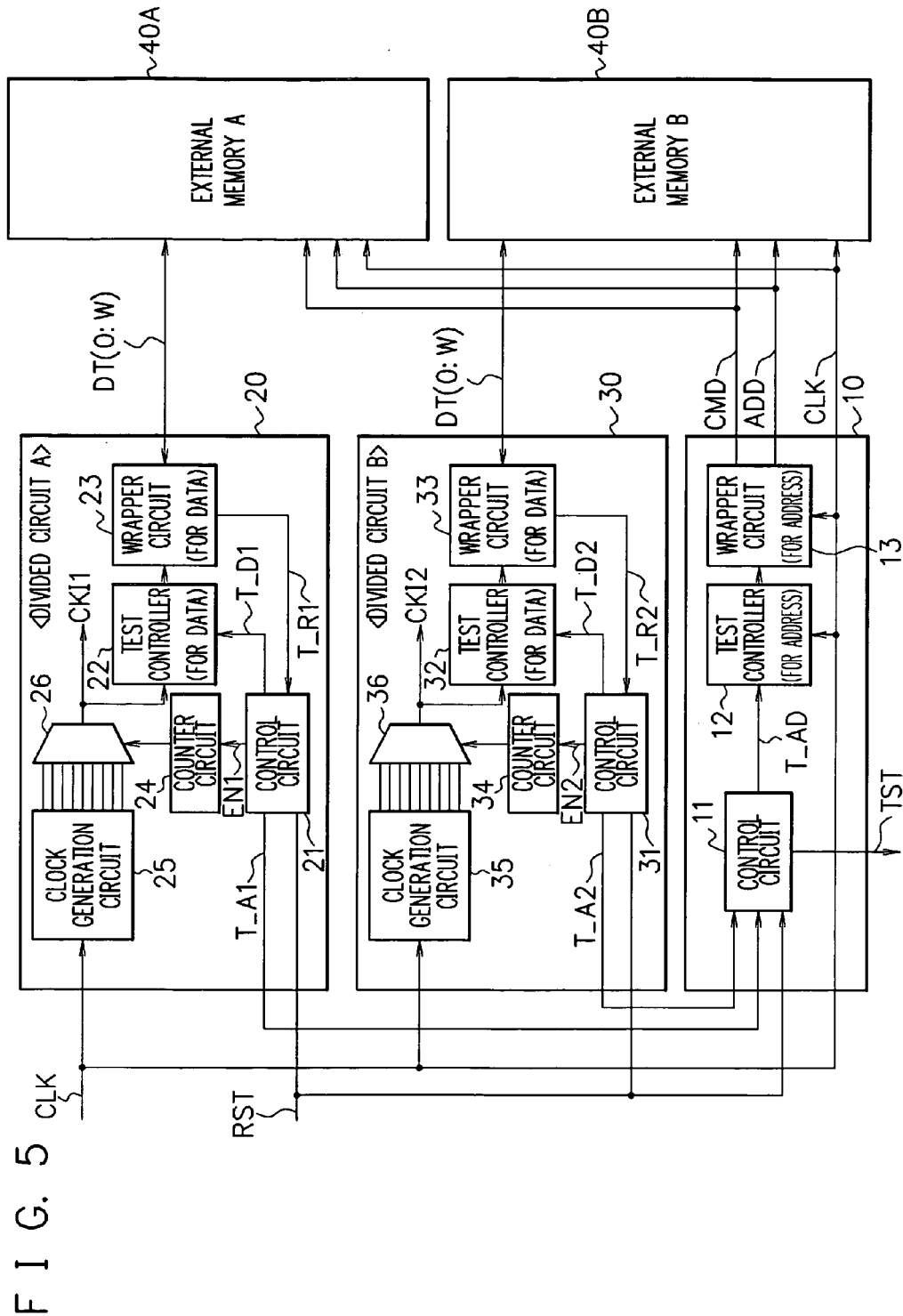
FIG. 5 is a view showing another configuration example of the memory controller according to the present embodiment.

In the description stated above, the case when one external memory 40 is controlled by the address generation circuit 10, and the data input/output circuits 20, 30 is shown as an example, but as shown in FIG. 5, external memories 40A, 40B may be respectively corresponded to the data input/output circuits 20, 30, and the two external memories 40A, 40B are controlled by the address generation circuit 10 and the data input/output circuits 20, 30. Incidentally, the configurations and the operations of the address generation circuit 10, the data input/output circuits 20, 30 are the same as those shown in FIG. 2, and therefore the explanation is not given.

When the memory controller is constituted as shown in FIG. 5, it becomes possible to share the address signal ADD and the command signal CMD from the address generation circuit 10 constituted on one chip with the plural external memories, and thereby, a reduction of a cost can be realized when considered as a whole system. Incidentally, it goes without saying that further more external memories may be controlled similarly without limiting to the two external memories.

As stated above, according to the present embodiment, the skew can be adjusted automatically when the memory controller is constituted by the plural chips while being divided into the address generation circuit 10 being the address generation portion and the data input/output circuits 20, 30 being the data input/output portions. Concretely speaking, the internal clock signals having the different phases generated at the clock generation circuits 25, 26 based on the clock signal CLK to be the reference are automatically selected sequentially so as to shift the phase one after another based on the test result, the verification of the test operation is performed, and thereby, it becomes possible to select the clock signals with optimal phases for the respective chips to achieve the adjustment of the skew generated by being divided into the plural chips automatically, and to make the circuits operate properly as the memory controller. Consequently, a size is inevitably increasing in accordance with a function mountable on one chip becomes complicated and multifunctioned including the memory controller. However, reductions of the size and the electric power consumption can be expected by dividing the circuits into plural chips as stated above.

According to the present invention, plural internal clock signals having different phases with one another are generated based on a clock signal to be a reference, and phases of clock signals supplied to circuits within chips are adjusted based on results of test operations executed by using the internal clock signals. Herewith, a clock signal having an optimal phase can be obtained from among the plural internal clock signals, and a skew generated by being divided into plural chips can be adjusted automatically. Consequently, according to the present invention, it is possible to make circuits operate properly as a whole, even though the circuits composing one function macro are divided into plural chips.

Incidentally, the present embodiment stated above is to be considered in all respects as illustrative and no restrictive, and all changes which come within the meaning and range of equivalency of the claims are therefore intended to be embraced therein. The invention may be embodied in other specific forms without departing from the spirit of essential characteristics thereof.

What is claimed is:

1. A semiconductor device, in which function circuits composing one function macro are divided and mounted on plural chips, internal clock signals having different phases with one another are generated based on a clock signal to be a reference, one of the generated internal clock signals is selected, and a phase of a clock signal supplied to the function circuits within the chips is adjusted based on a result of a test operation performed by using the selected internal clock signal.

2. The semiconductor device according to claim 1, wherein the test operation is performed by using the internal clock signal sequentially selected one by one from among the internal clock signals, and the internal clock signal verified the normal operation by the test operation is determined to be the clock signal supplied to the function circuits within the chips.

3. The semiconductor device according to claim 1, wherein the test operation is executed by using a self test circuit.

4. The semiconductor device according to claim 1, wherein the function circuits are memory control circuits of which at least an address generation portion and a data input/output portion are mounted on the different chips, and wherein a skew between an address signal outputted from the address generation portion and a data signal inputted/outputted to/from the data input/output portion is adjusted by phase adjustments of the clock signals.

5. The semiconductor device according to claim 4, wherein the test operation is an operation in which a test data is written and read to/from a memory by using a memory self test circuit, and the internal clock signal at the time when the read data and the test data are consistent is determined to be the clock signal supplied to the function circuits within the chips.

6. A semiconductor device in which function circuits composing one function macro are divided and mounted on plural chips, comprising:

a clock generation circuit generating internal clock signals having different phases with one another based on a clock signal to be a reference;

a clock selection circuit selecting one of the internal clock signals generated by said clock generation circuit; and a phase adjusting circuit adjusting a phase of a clock signal supplied to the function circuits within the chips based on a result of a test operation performed by using the internal clock signal selected by said clock selection circuit.

7. The semiconductor device according to claim 6, wherein said clock selection circuit selects the internal clock signal automatically with reference to the result of the test operation.

8. The semiconductor device according to claim 7, wherein said clock selection circuit sequentially selects the internal clock signals generated by said clock generation circuit one by one until a normal operation is verified at the test operation, and wherein the internal clock signal which is verified the normal operation at the test operation is determined as the clock signal supplied to the function circuits within the chips.

9. The semiconductor device according to claim 6, further comprising a self test circuit executing the test operation.

10. The semiconductor device according to claim 6, wherein the function circuits are memory control circuits of which at least an address generation portion and a data input/output portion are mounted on different chips.

11. The semiconductor device according to claim 10, further comprising a memory self test circuit executing the test operation, and wherein said memory self test circuit includes:

a memory access circuit writing a test data to a memory, and thereafter reading the data from a region to which the corresponding writing is performed; and a comparison circuit comparing the data read by the memory access circuit and the test data, and outputting a compared result as the result of the test operation.

12. A skew adjusting method of a semiconductor device in which function circuits composing one function macro are divided and mounted on plural chips, said skew adjusting method comprising the steps of:

generating internal clock signals having different phases with one another based on a clock signal to be a reference;

selecting the generated internal clock signal one by one; and performing a test operation by using the selected internal clock signal, and adjusting a phase of a clock signal supplied to the function circuits within the chips based on the result of the test operation.

13. The skew adjusting method according to claim 12, wherein the function circuits are memory control circuits of which at least an address generation portion and a data input/output portion are mounted on different chips, and wherein the internal clock signal is selected based on the result of the test operation executed by using the memory self test circuit, and the phase of the clock signal supplied to the function circuits within the chips is adjusted.

* * * * *